(12) United States Patent
Litoshenko et al.

(10) Patent No.: US 11,148,230 B2
(45) Date of Patent: Oct. 19, 2021

(54) METHOD OF MANUFACTURING DEPOSITION MASK

(71) Applicant: Samsung Display Co., Ltd., Yongin-si (KR)

(72) Inventors: Taras Litoshenko, Yongin-si (KR); Voronov Alexander, Yongin-si (KR); Gyoowan Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 432 days.

(21) Appl. No.: 16/166,170

(22) Filed: Oct. 22, 2018

(65) Prior Publication Data

US 2019/0126406 A1    May 2, 2019

(30) Foreign Application Priority Data

Nov. 1, 2017  (KR) .................. 10-2017-0144662

(51) Int. Cl.
| | |
|---|---|
| *B23K 26/382* | (2014.01) |
| *B23K 26/082* | (2014.01) |
| *B23K 26/067* | (2006.01) |
| *B23K 26/0622* | (2014.01) |
| *C23C 14/04* | (2006.01) |
| *C23C 16/04* | (2006.01) |
| *B23K 26/06* | (2014.01) |
| *H01L 51/00* | (2006.01) |

(52) U.S. Cl.
CPC ........ *B23K 26/382* (2015.10); *B23K 26/0622* (2015.10); *B23K 26/0626* (2013.01); *B23K 26/0676* (2013.01); *B23K 26/082* (2015.10); *C23C 14/042* (2013.01); *C23C 16/042* (2013.01); *H01L 51/0011* (2013.01)

(58) Field of Classification Search
CPC ............ B23K 26/0622; B23K 26/0626; B23K 26/0676; B23K 26/082; B23K 26/382; C23C 14/042; C23C 14/12; C23C 16/042
USPC ..................................................... 219/121.61
See application file for complete search history.

(56) References Cited

U.S. PATENT DOCUMENTS

| | | |
|---|---|---|
| 5,744,780 A | 4/1998 | Chang et al. |
| 6,642,477 B1 | 11/2003 | Patel et al. |

(Continued)

FOREIGN PATENT DOCUMENTS

| | | | |
|---|---|---|---|
| CN | 10545324 | * | 3/2016 |
| KR | 10-2013-0037482 | | 4/2013 |
| KR | 10-1674499 | | 11/2016 |

OTHER PUBLICATIONS

Translation of Cited KR20130037482 (Year: 2011).*

*Primary Examiner* — Dana Ross
*Assistant Examiner* — Joseph W Iskra
(74) *Attorney, Agent, or Firm* — H.C. Park & Associates, PLC

(57) ABSTRACT

A method of manufacturing a deposition mask including: arranging a deposition mask to be processed on a stage and forming a deposition hole in the deposition mask by irradiating the deposition mask with a laser beam. The laser beam forming the deposition hole is irradiated plural times in an identical moving path in a region where the deposition hole is formed, the laser beam includes a pulse laser, and pulse energy of the laser beam when the laser beam is irradiated once is different from pulse energy of the laser beam when the laser beam is irradiated twice.

16 Claims, 4 Drawing Sheets

(56) References Cited

U.S. PATENT DOCUMENTS

| | | | |
|---|---|---|---|
| 6,967,779 B2* | 11/2005 | Fadel | G02B 3/0012 |
| | | | 359/619 |
| 9,576,862 B2* | 2/2017 | Murray | G01N 21/9501 |
| 2003/0066821 A1 | 4/2003 | Wybrow et al. | |
| 2003/0150384 A1* | 8/2003 | Baude | H01L 51/0011 |
| | | | 118/721 |
| 2004/0094524 A1 | 5/2004 | Stevens | |
| 2004/0142108 A1 | 7/2004 | Atobe et al. | |
| 2011/0240617 A1* | 10/2011 | Xu | B23K 26/00 |
| | | | 219/121.72 |
| 2012/0267350 A1 | 10/2012 | Howerton et al. | |
| 2015/0068455 A1* | 3/2015 | Lee | B23K 26/382 |
| | | | 118/504 |

* cited by examiner

METHOD OF MANUFACTURING DEPOSITION MASK

CROSS-REFERENCE TO RELATED APPLICATION

This application claims priority from and the benefit of Korean Patent Application No. 10-2017-0144662, filed on Nov. 1, 2017, which is hereby incorporated by reference for all purposes as if fully set forth herein

BACKGROUND

Field

Exemplary embodiments of the invention relate generally to a method of manufacturing a deposition mask.

Discussion of the Background

In general, an organic light-emitting diode (OLED) display, which is capable of realizing color by using a principle whereby light is generated when excitons, which are generated as holes and electrons injected from an anode and a cathode combine in an emission layer, change from an excited state to a ground state, has pixels in a stacked structure in which the emission layer is interposed between a pixel electrode serving as the anode and an opposite electrode serving as the cathode.

Each of the pixels may actually be a sub-pixel such as, for example, a red sub-pixel, a green sub-pixel, or a blue sub-pixel, and a desired color may be rendered by a color combination of the three colored sub-pixels. That is, a structure in which an emission layer emitting light of any one of red, green, and blue colors is interposed between two electrodes for each sub-pixel, and color of one unit is displayed by a combination of red, green, and blue colored lights.

The electrodes and the emission layer of the OLED display may be formed by a deposition process. That is, a mask having a deposition hole with the same pattern as that of a thin-film layer to be formed is aligned on a substrate, and a thin-film material is deposited on the substrate through a deposition hole of the aligned mask to form a thin film of a desired pattern on the substrate. The mask is often used as a mask frame assembly together with a frame for supporting an end portion thereof, and the deposition hole may be generally formed by a wet-etching process using photoresist.

However, it is difficult to precisely form the deposition hole of the mask by the wet-etching process. Further, when both surfaces of the mask are etched to form the deposition hole, undercut portions may remain on a side surface of the deposition hole due to an isotropic nature of the wet-etching process. Such undercut portions may produce a so-called "shadow phenomenon" that interferes with accurate patterning.

The above information disclosed in this Background section is only for understanding of the background of the inventive concepts, and, therefore, it may contain information that does not constitute prior art.

SUMMARY

Exemplary embodiments of the inventive concepts provide a method of manufacturing a deposition mask capable of precisely and rapidly forming a deposition hole of the deposition mask.

Additional features will be set forth in part in the description which follows and, in part, will be apparent from the description, or may be learned by practice of the inventive concepts.

An exemplary embodiment of the inventive concepts provides a method of manufacturing a deposition mask including arranging a deposition mask to be processed on a stage and forming a deposition hole in the deposition mask by irradiating the deposition mask with a laser beam. The laser beam forming the deposition hole is irradiated plural times in an identical moving path in a region where the deposition hole is formed, and the laser beam includes a pulse laser, and pulse energy of the laser beam when the laser beam is irradiated once is different from pulse energy of the laser beam when the laser beam is irradiated twice.

In the region where the deposition hole is formed, a moving path of the laser beam may include a first point and a second point that are different from each other, and pulse energies of the laser beams when the laser beam is irradiated once or twice at the first point and the second point may be different from each other.

A moving path of the laser beam may have a spiral shape, and the laser beam may continuously move from an edge of the region where the deposition hole is formed to a center thereof.

Pulse energy of the laser beam at the edge of the region where the deposition hole is formed may be greater than pulse energy of the laser beam at the center thereof.

The moving path of the laser beam may be set by input data prior to the irradiation of the laser beam, and the data may include data on the laser beam, data on the deposition mask, and data on a deposition hole.

At least one of a moving speed of the laser beam, pulse energy of the laser beam, and the number of times of irradiation of the laser beam may be set together with the moving path of the laser beam.

The data on the deposition mask may include a name and thickness of a material forming the deposition mask.

The laser beam may be divided into a plurality of divided laser beams by a beam splitter, and each of the plurality of divided laser beams may form the deposition hole.

A plurality of deposition holes may be formed in the deposition mask so as to be spaced apart from each other, and the laser beam may not be irradiated between two adjacent deposition holes.

An exemplary embodiment of the inventive concepts also provides a method of manufacturing a deposition mask including inputting data on a laser beam, data on a deposition mask, and data on a deposition hole; setting a moving path of the laser beam according to the input data; and forming the deposition hole by irradiating the deposition mask with the laser beam. At least one of a moving speed of the laser beam, pulse energy of the laser beam, and the number of times of irradiation of the laser beam is set together with the moving path of the laser beam.

The data on the deposition mask may be a name and thickness of a material forming the deposition mask.

The laser beam may be irradiated a plurality of times along the moving path of the laser beam.

Pulse energy of the laser beam when the laser beam is irradiated once may be different from pulse energy of the laser beam when the laser beam is irradiated twice.

The moving path of the laser beam may include a first point and a second point which are different from each other, and respective pulse energies of the laser beams at the first point and the second point may be different from each other.

A moving path of the laser beam may have a spiral shape, and the laser beam may continuously move from an edge of the region where the deposition hole is formed to a center thereof.

Pulse energy of the laser beam at the edge of the region where the deposition hole may be formed is greater than pulse energy of the laser beam at the center thereof.

The laser beam may be divided into a plurality of divided laser beams by a beam splitter, and each of the divided laser beams may form the deposition hole.

A plurality of deposition holes may be formed in the deposition mask so as to be spaced apart from each other, and the laser beam may not be irradiated between two adjacent deposition holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
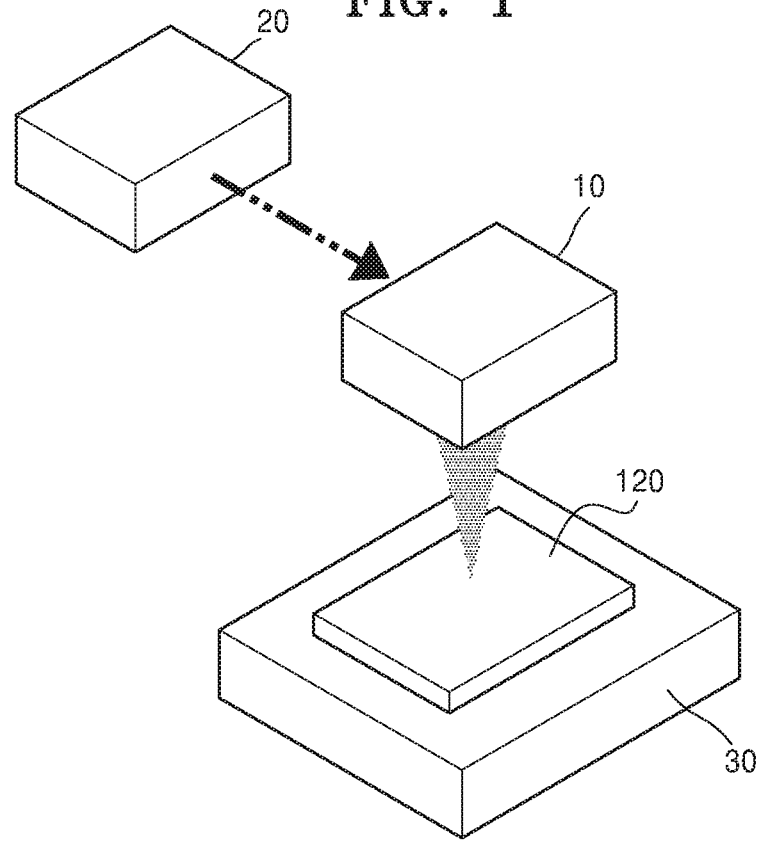
FIG. 1 is a perspective view of an example of a method of manufacturing a deposition mask according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
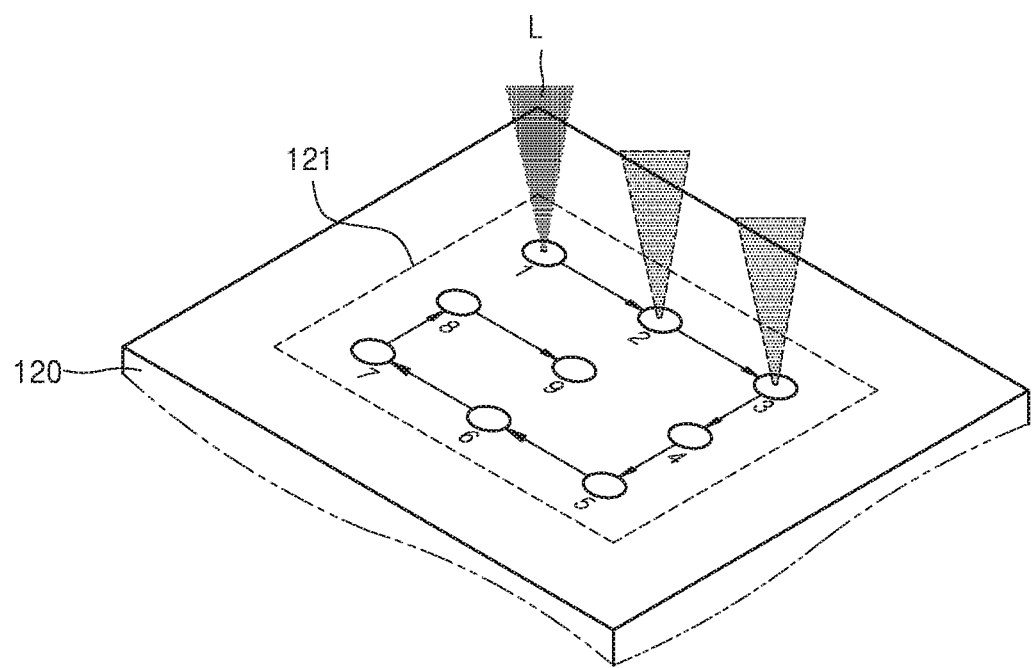
FIG. 2 is a perspective view of an example of a method of irradiating a laser beam for forming a deposition hole in the deposition mask of FIG. 1.
Figure 3:
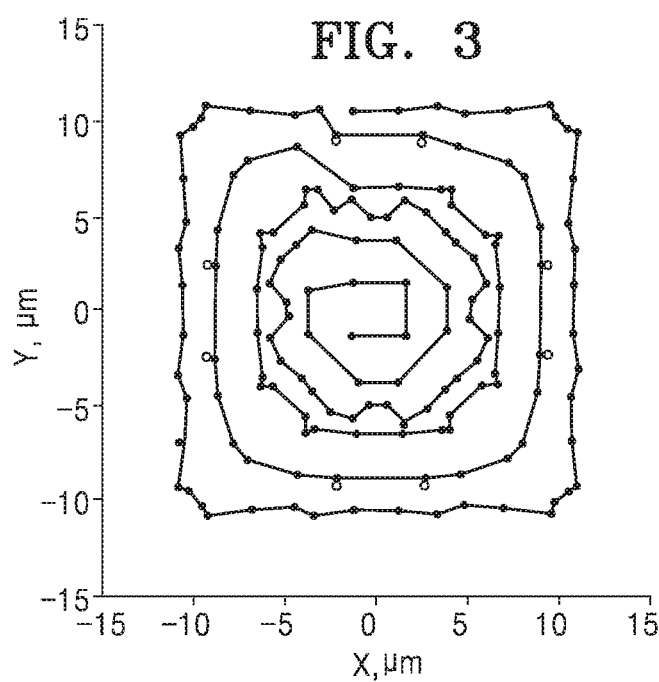
FIG. 3 is a graph of an example of an irradiation path of a laser beam set for forming a deposition hole in the deposition mask of FIG. 1.
Figure 4:
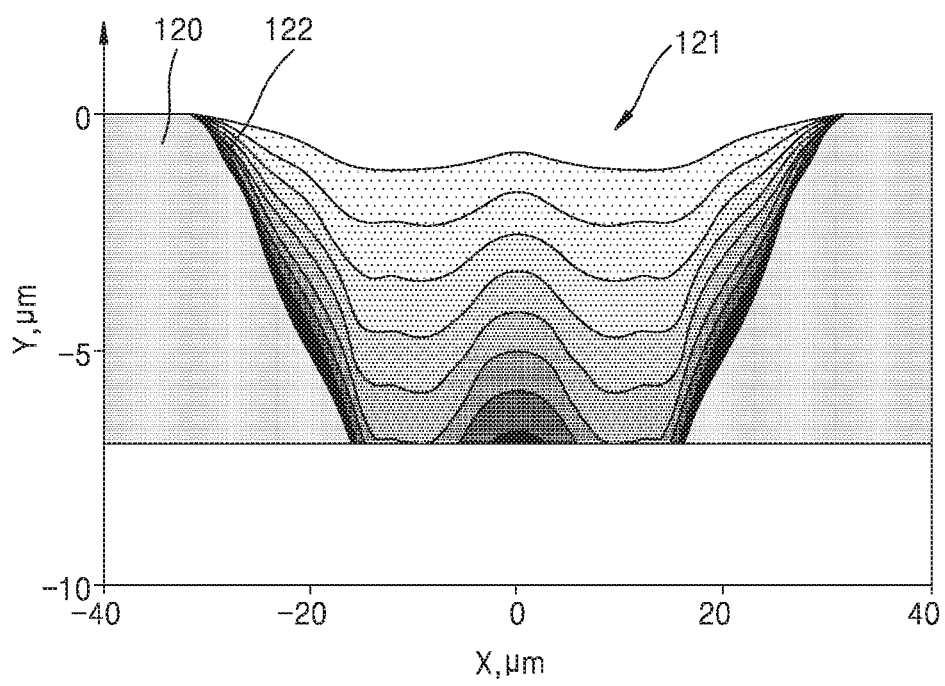
FIG. 4 is a graph of a process of forming a deposition hole in the deposition mask of FIG. 1.

FIG. 1 is a perspective view of an example of a method of manufacturing a deposition mask according to an exemplary embodiment, FIG. 2 is a perspective view of an example of a method of irradiating a laser beam for forming a deposition hole in the deposition mask of FIG. 1, FIG. 3 is a graph of an example of an irradiation path of a laser beam set for forming the deposition hole in the deposition mask of FIG. 1, and FIG. 4 is a graph of a process of forming the deposition hole in the deposition mask of FIG. 1.

FIG. 1 schematically shows a deposition mask manufacturing device capable of manufacturing a deposition mask 120. Referring to FIG. 1, the deposition mask manufacturing device may include a laser irradiator 10, a controller 20, and a stage 30. FIG. 1 illustrates a schematic configuration of the deposition mask manufacturing device, but the inventive concepts are not limited thereto. That is, in addition to the illustrated components, the deposition mask manufacturing device may additionally include other components such as various mirrors, lenses, or correction optical devices, and may further include a beam splitter.

The laser irradiator 10 irradiates a laser beam L toward the stage 30. The laser beam L may be a pulse laser.

The laser irradiator 10 may move relative to the stage 30. For example, a position of the stage 30 may be fixed while the laser beam L is irradiated, and the laser irradiator 10 may move in a horizontal direction and/or a vertical direction. A position of the laser irradiator 10 may be fixed while the laser beam L is irradiated, the position of the stage 30 may be moved, or the laser irradiator 10 and the stage 30 may move together.

The controller 20 controls an operation of the laser irradiator 10. For example, the controller 20 may receive data on the laser beam L, data on the deposition mask 120 to be processed, and data on a deposition hole 121 (of FIG. 2) to be formed, and a moving path of the laser beam L may be set based on the received data. At the same time, the controller 20 may set a moving speed of the laser beam L, pulse energy of the laser beam L, the number of times of irradiation of the laser beam L, and the like.

The data on the laser beam L may be pulse duration, a pulse repetition rate, a wavelength, a laser-beam spot size, and the like, and the data on the deposition mask 120 may be a material, strength, a thickness, an ablation threshold value, and the like of the deposition mask 120. Also, the data on the deposition hole 121 (of FIG. 2) may be about a shape of the deposition hole to be formed, or a difference between the deposition hole 121 (of FIG. 2) to be formed and the actual deposition hole 121 (of FIG. 2). The difference between the deposition hole 121 (of FIG. 2) and the actual deposition hole 121 (of FIG. 2) to be formed may be calculated by an accuracy matrix.

As an example, when power of the irradiated laser beam L is great, the controller 20 may set the moving path of the laser beam L, and may increase the moving speed of the laser beam L totally or partially, or control the laser irradiator 10 to reduce the number of times of irradiation of the laser beam L. As another example, when at least one of the strength, thickness, and ablation threshold value of the deposition mask 120 is large, the laser irradiator 10 may be controlled such that the moving speed of the laser beam L is totally or partially reduced or the number of times of irradiation of the laser beam L is increased.

The stage 30, on which the deposition mask 120 to be processed is placed, may fix the deposition mask 120 and may move relative to the laser irradiator 10. The deposition mask 120 may include various materials. For example, the deposition mask 120 may include an iron-nickel alloy INVAR or the like.

Hereinafter, a method of manufacturing the deposition mask 120 using the deposition mask manufacturing device of FIG. 1 will be described.

The method of manufacturing the deposition mask 120 may include an operation of arranging the deposition mask 120 to be processed on the stage 30 and an operation of forming the deposition hole 121 in the deposition mask 120 by irradiating the deposition mask 120 with the laser beam L.

FIG. 2 is a perspective view of an example of a method of irradiating the laser beam L for forming the deposition hole 121. As illustrated in FIG. 2, the moving path of the laser beam L has a spiral shape, and the laser beam L may continuously move from the edge of a region where the deposition hole 121 is formed to the center, or in the opposite direction. Accordingly, a horizontal cross-sectional area of the deposition hole 121 may become gradually narrower from a side to which the laser beam L is irradiated toward the opposite side.

Meanwhile, in FIG. 2, numerals 1 to 9 represent spot positions of the laser beam L, but this is for indicating the moving path of the laser beam L and does not mean that the beam L is irradiated only in the positions of the numerals 1 to 9. Furthermore, a spot size of the laser beam L shown in FIG. 2 is shown only for easy understanding of the moving path of the laser beam L, and the spot size of the laser beam L may vary.

As an example, a spot of any one of laser beams L may overlap a spot of another adjacent laser beam L. For example, a spot of a laser beam L at the ninth position may overlap spots of adjacent laser beams L at the second, fourth, sixth, and eighth positions. The overlapping area may be at least 50%. Therefore, even though the laser beam L is irradiated once in the region where the deposition hole 121 is formed, the result may be that the laser beam L is irradiated substantially twice or more by overlapping the spots.

Meanwhile, the laser beam L may be irradiated plural times in the same path in the region where the deposition hole 121 is formed. Pulse energy of the laser beam L when the laser beam L is irradiated once may be different from pulse energy for each irradiation when the laser beam L is irradiated twice.

In addition, in the region where the deposition hole 121 is formed, the moving path of the laser beam L includes a first point and a second point which are different from each other, and respective pulse energies of the laser beams L at the first point and the second point may be different from each other.

For example, when the moving path of the laser beam L has a spiral shape, pulse energy of a laser beam L at the edge of the deposition hole 121 may be greater than pulse energy of a laser beam L at the center of the deposition hole 121. That is, pulse energy of a laser beam L at a ninth point in FIG. 2 may be less than pulse energies of laser beams L at the other points 1 to 8. As illustrated in FIG. 4, this is because the pulse energy of a laser beam L irradiated near a side surface 122 of the deposition hole 121 needs to be greater than the pulse energy irradiated to the center of the deposition hole 121 because the laser beam L may be reflected from the side surface 122 of the deposition hole 121 when the laser beam L is irradiated in a vertical direction as the deposition hole 121 is formed with the side surface 122 having a tapered shape.

As described above, the laser beam L is irradiated from the laser irradiator 10, and the operation of the laser irradiator 10 may be controlled by the controller 20 based on input data. That is, it is understood that the method of manufacturing the deposition mask according to the present disclosure includes an operation of inputting data on the laser beam L, data on the deposition mask 120 to be processed, and data on the deposition hole 121 to be formed, and an operation of setting at least one of the moving path, the moving speed, and the pulse energy and the number of times of irradiation of the laser beam L by the input data.

The data on the deposition mask 120 may be replaced by inputting the thickness and material of the deposition mask 120. In other words, the controller 20 includes data on intrinsic properties of various materials that may be used as the deposition mask 120, and therefore, may input the data on the deposition mask 120 by simply inputting names of the thickness and material of the deposition mask 120.

FIG. 3 shows the moving path of the laser beam L set according to the input data. Referring to FIG. 3, the deposition hole 121 to be formed is substantially a square and the moving speed of the laser beam L along with the moving path of the laser beam L is displayed. That is, a narrow interval between small circles shown in FIG. 3 means a region where the moving speed of the laser beam L is relatively low, which appears at a corner of the deposition hole 121 requiring more precise etching, and the moving speed of the laser beam L increases toward the center of the deposition hole 121. Furthermore, pulse energies of the laser beams L at the first point and the second point on the moving path of the laser beam L may be different from each other. For example, the pulse energy of the laser beam L at the edge of the deposition hole 121 may be greater than the pulse energy of the laser beam L at the center of the deposition hole 121. Therefore, the deposition hole 121 may be formed quickly and precisely.

Furthermore, the laser beam L may be irradiated repeatedly a plurality of times along a moving path of an identical laser beam L. When the laser beam L is repeatedly irradiated to the same position, etching progresses gradually by the irradiated laser beam L to form the deposition hole 121, as shown in FIG. 4. The pulse energies of the laser beams L irradiated a plurality of times may be different from each other, and may vary depending on a position of the laser beam L. Therefore, not only the side surface of the deposition hole 121 may be formed into a tapered shape without step but also a taper angle of the side surface may be easily adjusted.

When a plurality of deposition holes 121, which are spaced apart from each other, are formed in the deposition mask 120, the laser beam L may be irradiated only when the plurality of deposition holes 121 are formed, and may not be irradiated in the spaces between the deposition holes 121.

Figure 5:
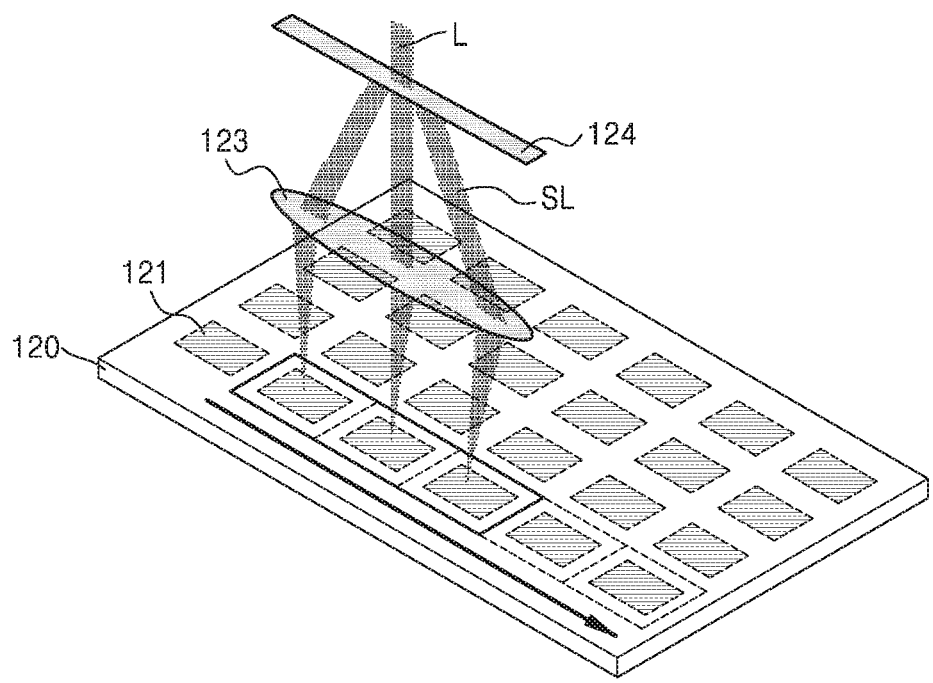
FIG. 5 is a perspective view of an example of a method of manufacturing a deposition mask according to another exemplary embodiment.

FIG. 5 is a perspective view of an example of a method of manufacturing a deposition mask according to another exemplary embodiment.

The method of manufacturing the deposition mask 120 of FIG. 5 includes an operation of arranging the deposition mask 120 to be processed on the stage 30 (of FIG. 1) and an operation of forming the deposition hole 121 by irradiating the deposition mask 120 with the laser beam L, wherein the laser beam L may be irradiated along a moving path of the laser beam L set by input data. The input data may be the data on the laser beam L, the data on the deposition mask 120 to be processed, and the data on the deposition hole 121 to be formed, and the controller 20 (of FIG. 1) may set at least one of the moving path, the moving speed, the pulse energy of the laser beam L, and the number of times of irradiation of the laser beam L.

Meanwhile, referring to FIG. 5, the laser beam L to be irradiated may be divided into a plurality of divided laser beams SL by a beam splitter 124, and each of the divided laser beams SL may pass through a condenser lens 123 and be focused on the deposition mask 120. Further, the divided laser beams SL may be perpendicularly incident on a surface of the deposition mask 120 through a telecentric lens.

Each of the divided laser beams SL incident on the deposition mask 120 may form a deposition hole 121. Therefore, manufacturing efficiency of the deposition mask 120 may be improved because the plurality of deposition holes 121 may be formed precisely and quickly.

Figure 6:
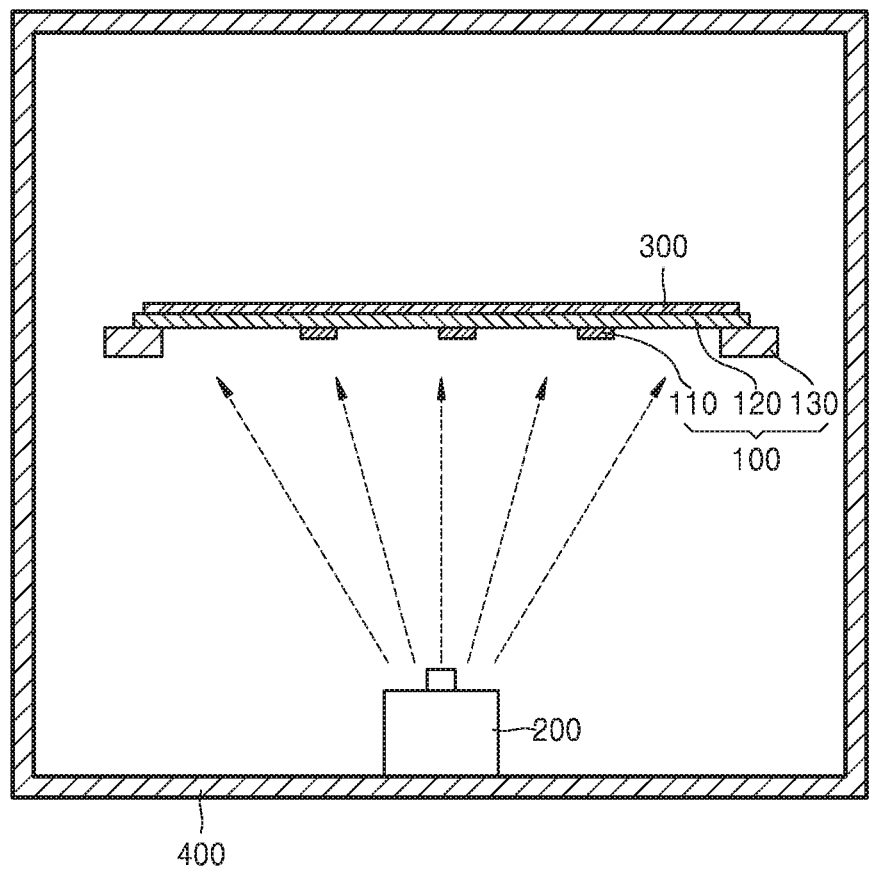
FIG. 6 is a cross-sectional view of an example of a deposition device using a deposition mask manufactured according to an exemplary embodiment.
Figure 7:
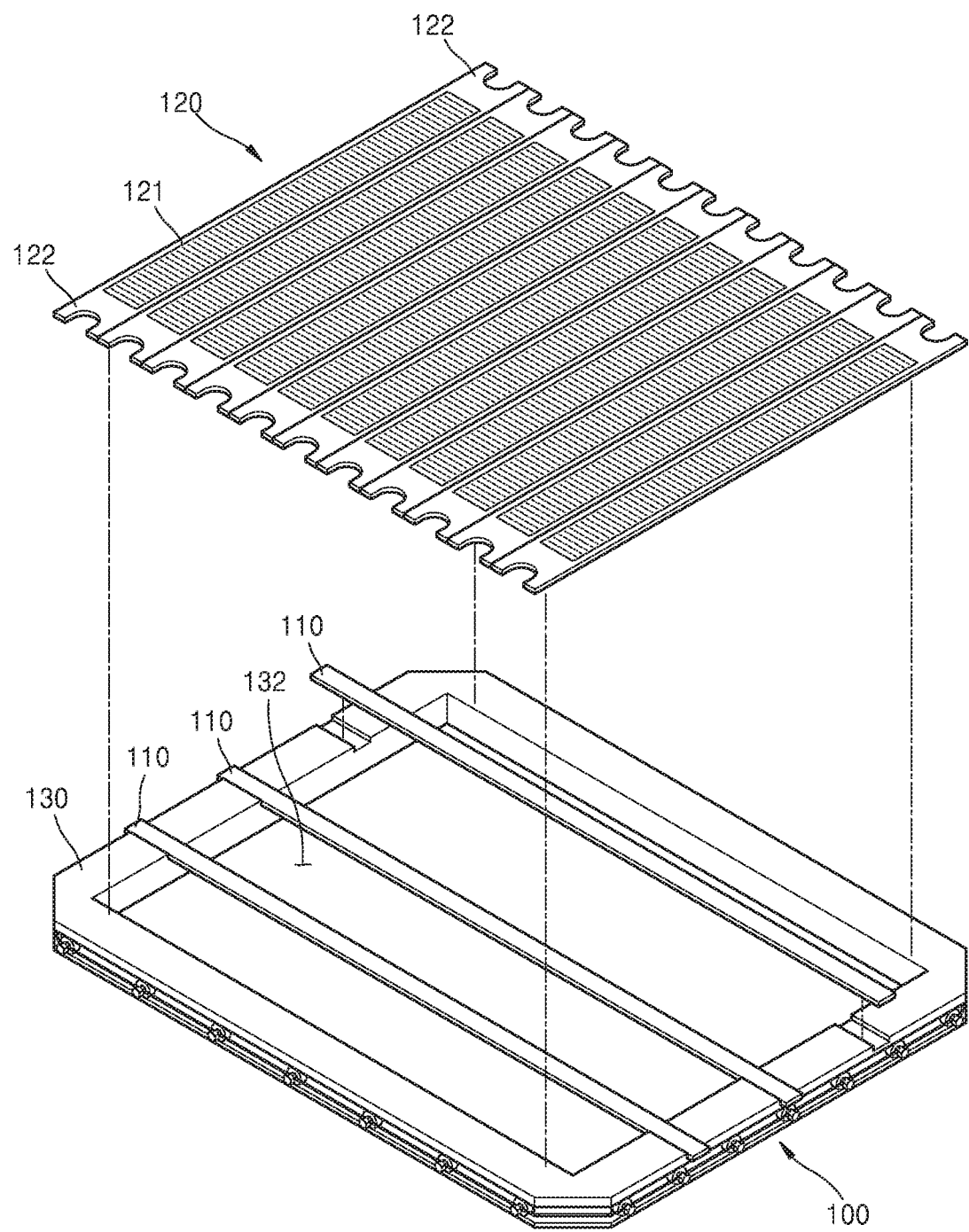
FIG. 7 is an exploded perspective view of an example of a mask frame assembly including the deposition mask of FIG. 6.

FIG. 6 is a cross-sectional view of an example of a deposition device using a deposition mask manufactured according to an exemplary embodiment, and FIG. 7 is an exploded perspective view of an example of a mask frame assembly including the deposition mask 120 of FIG. 6.

Referring to FIGS. 6 and 7, the deposition device may include the deposition mask 120 for forming a desired pattern on a target substrate 300, a vapor deposition source 200 for ejecting a deposition material toward the target substrate 300 in a chamber 400, and the like.

The deposition mask 120 may be used as a mask frame assembly 100 including a frame 130 for supporting both ends of the deposition mask 120, and a long-side stick 110 supported on the frame 130 to cross the deposition mask 120.

In more detail, as illustrated in FIG. 7, the mask frame assembly 100 may include the frame 130, a plurality of long-side sticks 110 having both ends fixed to the frame 130, and a plurality of deposition masks 120 perpendicular to the long-side sticks 110 and having both ends fixed to the frame 130.

The frame 130 forms an outer frame of the mask frame assembly 100, and has a rectangular shape with an opening 132 formed at the center thereof. Both ends of the long-side stick 110 are fixed by welding to a pair of opposing sides of the frame 130. Both ends of the deposition mask 120 are fixed to a pair of sides perpendicular to the sides of the frame 130 to which the long side stick 110 is welded.

As an example, the deposition mask 120 has elongated stick-shaped members and forms a plurality of deposition holes 121 located in an opening 132. Both ends of the deposition holes 121 are welded to the frame 130 as described above. Reference numeral 122 denotes a clamping unit. When the deposition mask 120 is welded to the frame 130, the clamping unit 122 is held and extended in a longitudinal direction and is removed by cutting after welding. The deposition mask 120 may be one large member, but in this case, a drooping phenomenon as a result of its own weight may be increased, so that the deposition mask 120 is divided into a plurality of sticks as shown in FIG. 2. Invar, which is an iron-nickel alloy, may be used as a material of the deposition mask 120.

The deposition mask 120 may include the deposition holes 121 having the same shape as a thin-film pattern to be deposited. That is, when the deposition material is ejected from the deposition source 200, the deposition material passes through the deposition hole 121 of the deposition mask 120 and is deposited on the substrate 300 to form a thin film having a predetermined pattern.

The deposition hole 121 may be formed by a method as shown and described with reference to FIGS. 1 to 5. Therefore, a side surface of the deposition hole 121 may be formed with a constant slope without a step. Also, since the deposition hole 121 is formed very precisely and does not cause a "shadow phenomenon" resulting from undercut portions, even though a thin film to be deposited has a fine pattern, a thin-film boundary portion may be clearly formed and a high quality thin-film may be formed.

According to exemplary embodiments, a deposition hole of a deposition mask may be precisely and quickly formed. Furthermore, a shape of the deposition hole, such as a taper angle of a side surface of the deposition hole, may be easily adjusted.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a deposition mask, the method comprising:
arranging a deposition mask to be processed on a stage; and
forming a deposition hole in the deposition mask by irradiating the deposition mask with a laser beam,
wherein:
the laser beam forming the deposition hole is irradiated plural times in an identical moving path in a region where the deposition hole is formed;
the laser beam comprises a pulse laser, and pulse energy of the laser beam when the laser beam is irradiated once is different from pulse energy of the laser beam for each irradiation when the laser beam is irradiated twice; and
a moving path of the laser beam has a spiral shape.

2. The method of claim 1, wherein:
in the region where the deposition hole is formed, a moving path of the laser beam includes a first point and a second point that are different from each other; and
the pulse energy of the laser beam when the laser beam is irradiated once or twice at the first point and the second point are different from each other.

3. The method of claim 1, wherein:
a moving path of the laser beam has a spiral shape; and
the laser beam continuously moves from an edge of the region where the deposition hole is formed to a center of the region.

4. The method of claim 3, wherein pulse energy of the laser beam at the edge of the region where the deposition hole is formed is greater than pulse energy of the laser beam at the center of the region.

5. The method of claim 1, wherein:
the moving path of the laser beam is set by input data prior to the irradiation of the laser beam; and
the data includes data on the laser beam, data on the deposition mask, and data on the deposition hole.

6. The method of claim 5, wherein at least one of a moving speed of the laser beam, pulse energy of the laser beam, and the number of times of irradiation of the laser beam is set together with the moving path of the laser beam.

7. The method of claim 5, wherein the data on the deposition mask includes a name and thickness of a material forming the deposition mask.

8. The method of claim 1, wherein:
the laser beam is divided into a plurality of divided laser beams by a beam splitter;
and each of the plurality of divided laser beams forms the deposition hole.

9. The method of claim 1, wherein:
a plurality of deposition holes are formed in the deposition mask so as to be spaced apart from each other; and
the laser beam is not irradiated between two adjacent deposition holes.

10. A method of manufacturing a deposition mask, the method comprising:
inputting data on a laser beam, data on a deposition mask, and data on a deposition hole;
setting a moving path of the laser beam according to the input data; and
forming the deposition hole by irradiating the deposition mask with the laser beam,
wherein:
at least one of a moving speed of the laser beam, pulse energy of the laser beam, and the number of times of irradiation of the laser beam is set together with the moving path of the laser beam;
the laser beam is irradiated a plurality of times along the moving path of the laser beam;

pulse energy of the laser beam when the laser beam is irradiated once is different from pulse energy of the laser beam for each irradiation when the laser beam is irradiated twice, and a moving path of the laser beam has a spiral shape.

11. The method of claim 10, wherein the data on the deposition mask is a name and thickness of a material forming the deposition mask.

12. The method of claim 10, wherein:

the moving path of the laser beam includes a first point and a second point which are different from each other; and respective pulse energies of the laser beams at the first point and the second point are different from each other.

13. The method of claim 10, wherein:

a moving path of the laser beam has a spiral shape; and the laser beam continuously moves from an edge of the region where the deposition hole is formed to a center of the region.

14. The method of claim 13, wherein pulse energy of the laser beam at the edge of the region where the deposition hole is formed is greater than pulse energy of the laser beam at the center of the region.

15. The method of claim 10, wherein:

the laser beam is divided into a plurality of divided laser beams by a beam splitter; and each of the divided laser beams forms the deposition hole.

16. The method of claim 10, wherein:

a plurality of deposition holes are formed in the deposition mask so as to be spaced apart from each other; and the laser beam is not irradiated between two adjacent deposition holes.

\* \* \* \* \*